United States Patent [19]

Ohba et al.

[11] Patent Number: 4,792,958
[45] Date of Patent: Dec. 20, 1988

[54] SEMICONDUCTOR LASER WITH MESA STRIPE WAVEGUIDE STRUCTURE

[75] Inventors: Yasuo Ohba, Yokohama; Masayuki Ishikawa, Tokyo; Motoyuki Yamamoto, Kawasaki; Yukio Watanabe, Yokohama; Hideto Sugawara, Tokyo, all of Japan

[73] Assignee: Kabushiki Kaisha Toshiba, Kawasaki, Japan

[21] Appl. No.: 19,332

[22] Filed: Feb. 26, 1987

[30] Foreign Application Priority Data

Feb. 28, 1986 [JP] Japan .................................. 61-42933
Feb. 28, 1986 [JP] Japan .................................. 61-42934

[51] Int. Cl.$^4$ .............................................. H01S 3/19
[52] U.S. Cl. ....................................... 372/45; 372/44; 372/46; 357/17
[58] Field of Search ..................... 372/43, 44, 45, 46; 357/17

[56] References Cited

FOREIGN PATENT DOCUMENTS 0005273 3/1979 Japan .
0119884 7/1984 Japan ................................. 372/43
0258987 12/1985 Japan ................................. 372/43

OTHER PUBLICATIONS

Mawst et al, Complementary Self-Aligned Laser By Metalorganic Chemical Vapor Deposition, Electronics Letters, vol. 21, No. 20, Sep. 26, 1985, pp. 903-905.
Asahi et al, "Molecular Beam Epitaxial Growth of InGaAlP Visible Laser Diode Operating at 0.66-0.68 μm at Room Temperatures", J. Appl. Phys., 54(12), Dec. 1983, pp. 6458-6964.

Primary Examiner—William L. Sikes
Assistant Examiner—Georgia Y. Epps
Attorney, Agent, or Firm—Oblon, Fisher, Spivak, McClelland & Maier

[57] ABSTRACT

There is disclosed a semiconductor layer which can emit a continuous laser beam in a visible wavelength range. The laser has an n-GaAs substrate. On this substrate, an n-InGaAlP cladding layer, an active layer, and p-InGaAlP cladding layers are sequentially formed, thus forming a double hetero-structure. A mesa-shaped, upper cladding layer is provided, defining a laser beam-guiding channel. A thin p-InGaAlP contact layer and a mesa-shaped, p-GaAs contact layer are formed on the top surface of the upper cladding layer. Two n-type semiconductive, current-blocking layers cover the slanted sides of the upper, mesa-shaped cladding layer and also the contact layer. They are made of the same n-GaAs compound semiconductor material as the substrate.

14 Claims, 5 Drawing Sheets

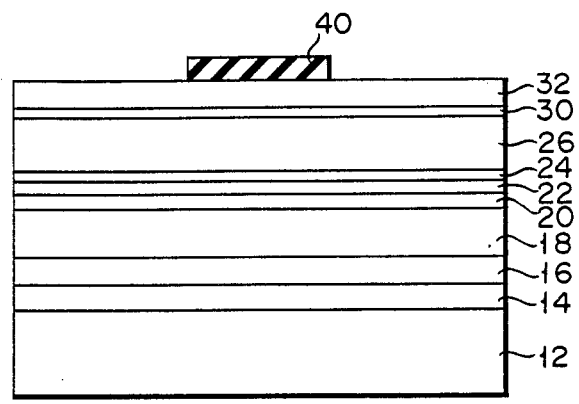
F I G. 2A
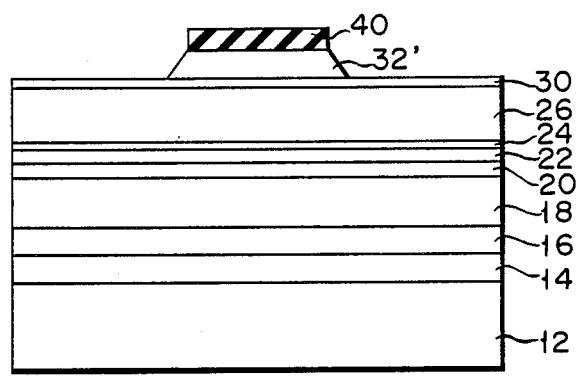
F I G. 2B
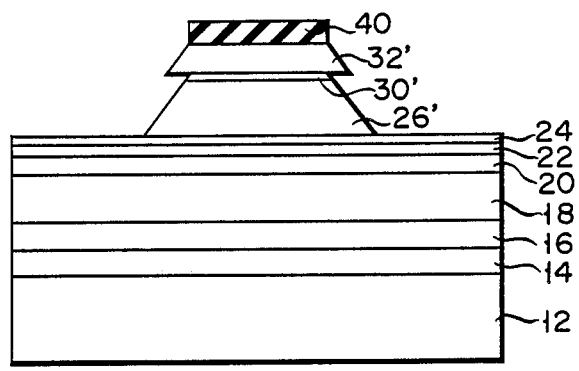
F I G. 2C

SEMICONDUCTOR LASER WITH MESA STRIPE WAVEGUIDE STRUCTURE

BACKGROUND OF THE INVENTION

1. Field of the Invention:

The present invention relates to a semiconductor laser and, more particularly, to a semiconductor laser which operates at room temperature in a fundamental transverse-oscillation mode to continuously emit visible light.

2. Discussion of the Background:

As is generally known, semiconductor lasers have a multilayer structure, each including a semiconductive substrate, cladding layers of GaAlAs, an active layer of GaAs, a current-blocking layer of GaAs, and the like. One of the cladding layers is formed above the active layer. A channel groove is cut in the upper surface of this cladding layer for blocking a current and guiding the light generated in the laser. To manufacture such a multilayer laser, it is required that the recrystallization of each layer be strictly controlled to impart uniform and good crystallinity to the layer. Unless this requirement is fulfilled, the laser will have but a low oscillation stability and, hence, will fail to operate reliably.

Recently, a vapor-phase growing method called "metal organic chemical vapor deposition (MOCVD)" has been developed to take the place of the liquid-phase epitaxy (LPE) method which has been used for some time. The MOCVD method can substantially satisfy the condition required in recrystallizing the layers of the semiconductor laser. It is, therefore, preferred as a method which can produce a greatly reliable semiconductor laser. This method, however, is disadvantageous in that crystals having a high light-emitting efficiency must be grown on that surface of a layer in which a channel groove is cut. Highly reliable GaAlAs lasers having channel grooves have yet to be reported.

Semiconductor materials for lasers, such as InGaAsP, InGaAlAs and InGaAlP, are now attracting attention. This is because semiconductor lasers made of these materials emit laser beams with such a broad wavelength range that they can be used in optical communication systems or in optical data storage systems. These semiconductor materials can indeed be formed by the vapor-phase growth method. However, no reports have been made of a semiconductor laser which is made of InGaAlAs and InGaAlP or the like, and which can continuously emit stable visible light at room temperature in a fundamental transverse-oscillation mode. The reason is because these materials must be formed under strictly controlled conditions in order to have a crystal lattice well aligned with that of the substrate. In practice, it is extremely difficult to successfully control these conditions. Were a semiconductor laser made of any one of these materials, it would have its basic characteristic degraded quickly (for example, within about one hour), and would thus become useless.

SUMMARY OF THE INVENTION

It is therefore an object of the present invention to provide a new and improved semiconductor laser which is formed of a specific semiconductor material such as InGaAlAs, InGaAlP or the like, and which can continuously emit stable visible light in a fundamental transverse oscillation mode.

Another object of the invention is to provide a new and improved method for manufacturing a semiconductor laser which is formed of a semiconductor material such as InGaAlAs, InGaAlP or the like, and which can continuously emit stable visible light in a fundamental transverse oscillation mode.

In accordance with the above object, the present invention is addressed to a semiconductor laser which emits a continuous laser beam in the visible wavelength range. The laser comprises a semiconductor substrate of a first conductivity type, made of a semiconductor compound of III-elements and V-elements, a first semiconductor cladding layer of the first conductivity type positioned above the substrate, and an active layer of undoped semiconductor material formed on the first cladding layer.

A plurality of semiconductor cladding layers of a second conductivity type is formed on the active layer, thereby forming a double hetero-structure. These cladding layers include a second cladding layer formed on the active layer, and a third cladding layer formed on the second cladding layer. The third cladding layer is mesa-shaped, and has slanted sides. It defines a waveguide channel for laser light. The first to third cladding layers are made of a semiconductor compound including III-elements and V-elements.

A semiconductor contact layer of the second conductivity type is formed on the third cladding layer. The contact layer is formed to have a mesa stripe with slant sides. A semiconductive, current-blocking layer covers the slant sides of the third cladding layer and also the slant sides of the contact layer. The current-blocking layer is made of a semiconductor compound including III-elements and V-elements, being substantially the same as the material of the substrate.

The invention, and its object and advantages, will become more apparent in the detailed description of a preferred embodiment, presented below.

BRIEF DESCRIPTION OF THE DRAWINGS

In the detailed description of a preferred embodiment of the invention, given below, reference will be made to the accompanying drawings in which:

FIGS. 2A to 2F are cross-sectional views of multilayer structures obtained in the main steps of manufacturing the diode of FIG. 1;

DETAILED DESCRIPTION OF THE PREFERRED EMBODIMENTS

Figure 1:
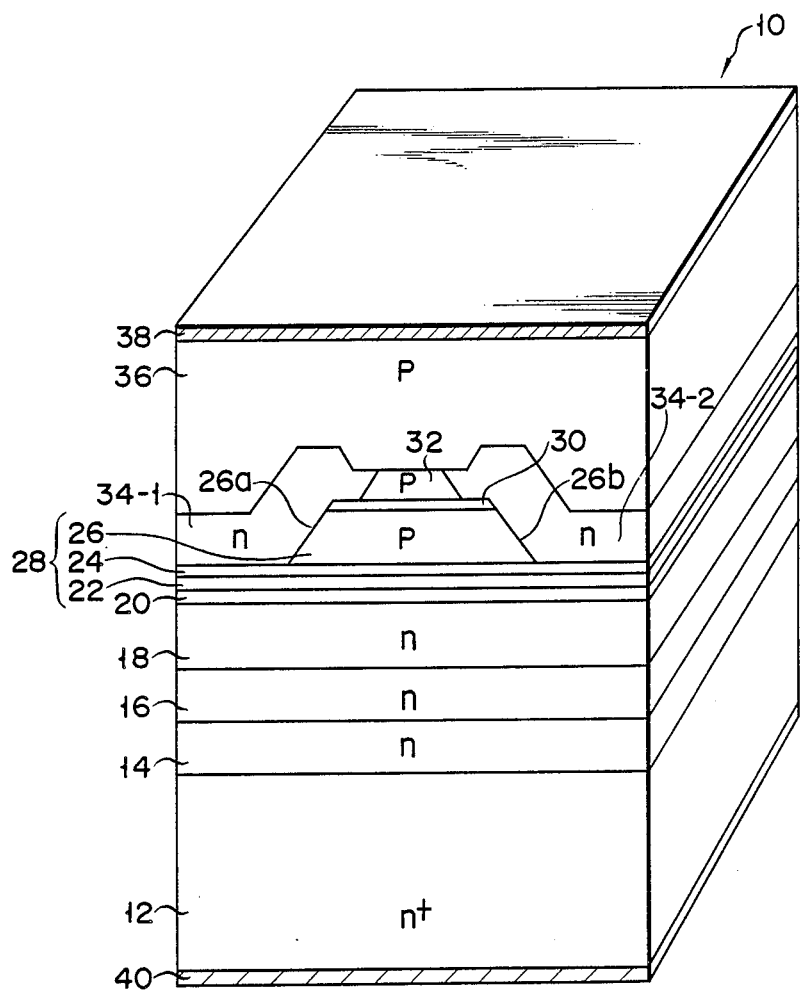
FIG. 1 is a perspective view (not drawn to scale) of a semiconductor layer diode capable of stably operating in a transverse mode, in accordance with one preferred embodiment of the invention.

There is shown in FIG. 1 of the drawings a transverse mode stabilized semiconductor laser diode with a double-heterostructure and a mesa stripe waveguide structure, which is designated generally by the numeral 10. As shown in FIG. 1, laser diode 10 has n type GaAs substrate 12 of high impurity concentration. On one side of substrate 12 are disposed, one above another, n type GaAs buffer layer 14, n type InGaP buffer layer 16, n type InGaAlP cladding layer (or, first cladding layer) 18, undoped InGaP active layer 20, and cladding layer unit (or, second cladding layer) 28 consisting of p type InGaAlP layers 22, 24 and 26. First cladding layer 18, active layer 20 and second cladding layer 28 constitute a double hetero-structure.

P type InGaAlP layer 24 (hereinafter called "p-InGaAlP layer") contains aluminum in a lower composition ratio than other p-InGaAlP layers 22 and 26, and therefore serves as an etching stopper in manufacturing laser diode 10, as will be described later in detail. Layer 26 is formed on layer 24 to have a mesa stripe shape characterized by two slant sides 26a and 26b. Layer 26 thus provides a linear projection or rib, defining a mesa-shaped waveguide channel.

Thin contact layer 30 made of p-InGaAlP is formed on the upper surface of mesa-shaped cladding layer 26. Another contact layer 32 of p-GaAs is formed on thin contact layer 30. Contact layer 32 is shaped in a mesa stripe, and is narrower than cladding layer 26. Current-blocking layers 34-1 and 34-2 are formed on cladding layer 28, such that they cover mesa-shaped cladding layer 26, thin contact layer 30 and the slanted sides of mesa-shaped contact layer 32. Neither layer 34-1 nor layer 34-2 cover the upper surface of contact layer 32. Current-blocking layers 34 contact those surfaces of mesa-shaped cladding layer 26 which face the waveguide channel. They also contact layers 30 and 32. Layer 32 and layers 34-1 and 34-2 can perform the current-blocking function.

Further, thick p-GaAs contact layer 36 is formed to cover current-blocking layers 34 and on the upper surface of mesa-shaped contact layer 32. Since layer 36 is made so thick that its upper surface is flat, laser diode 10 has a square cross-section. Flat metal layer 38 is formed on upper contact layer 36. A flat metal layer 40 is formed on the lower surface of substrate 12. Hence, metal layers 38 and 40 sandwich the laser diode, and function as the terminal electrodes of laser diode 10.

Laser diode 10 thus constructed emits a continuous-wave, visible laser light such that upper contact layer 32 and current-blocking layers 34-1 and 34-2 carry out the current blocking operation, and p-InGaAlP cladding layer 18, which defines the mesa-shaped channel, guides the laser light generated within diode 10. Since buffer layer 16 is interposed between GaAs buffer layer 14 and the InGaAlP hetero-structure, it can improve the crystallinity of the hetero-structure. Thin contact layer 30 is provided to reduce the electric contact resistance between cladding layer 26 and contact layer 32. Thin contact layer 30 is comprised of semiconductor material having a band gap greater than that of contact layer 32 lying over layer 30, but smaller than that of layer 26 lying under layer 30. The band gap may be varied within thin contact layer 30. In this case, it is preferable that the band gap width of contact layer 30 is equal to that of layer 26 in the interface region between layers 26 and 30 and to that of layer 32 in the interface region between layers 30 and 32, and changed gradually in the other region of layer 30 in the vertical direction.

Substrate 12 is generally made of a III-V semiconductor compound. First to fourth cladding layers 18, 22, 24 and 26, which form a oouble hetero-structure junction, are made of semiconductor compounds each including a plural kinds of III-elements and at least one V-element. Typically, these cladding layers are made of $In_xGa_{1-x-y}As_yP$ ($0 \leq y \leq 1$), $In_xGa_{1-x-y}Al_yP$ ($0 \leq y \leq 1$), or $In_xGa_{1-x-y}Al_yAs$ ($0 \leq y \leq 1$). Current-blocking layers 34-1 and 34-2 are formed of a semiconductor compound which is substantially the same as the III-V semiconductor compound forming substrate 12. When substrate 12 is made of GaAs, current-blocking layers 34-1 and 34-2 are made of $Ga_{1-z}Al_zAs$ ($0 \leq z \leq 1$). (In the embodiment described above, layers 34 are made of GaAs.) On the other hand, when substrate 12 is made of InP, current-blocking layers 34 must be formed of InP.

Laser diode 10 having the mesa-shaped waveguide structure was made on an experimental basis by the inventors hereof, as will be explained with reference to FIGS. 2A to 2F. First, n type GaAs substrate 12 having crystal plane (100) and doped with silicon in the concentration of $3 \times 10^{18}$ cm$^{-3}$ was prepared. The MOCVD mehhod was then performed at atmospheric pressure or a lower pressure, using a gas mixture of a methane-series III-group organic metal (e.g., trimethyl indium, trimethyl gallium or trimethyl aluminum) and a hydride of V-group metal (e.g., arsine or phosphine), at atomspheric pressure or a lower pressure. As a result, buffer layers 14 and 16, cladding layer 18, active layer 20, cladding layers 22, 24 and 26, and contact layers 30 and 32 were formed on substrate 12, one upon another in the order illustrated in FIG. 1, thereby obtaining a wafer of double hetero-structure.

First buffer layer 14 was an n type GaAs layer doped with selenium in the concentration of $3 \times 10^{18}$ cm$^{-3}$ and having a thickness of 0.5 $\mu$m. Second buffer layer 16 was an n type InGaP layer doped with selenium in the concentration of $3 \times 10^{18}$ cm$^{-3}$ and having a thickness of 0.5$\mu$m. First cladding layer 18 was an n type $In_{0.5}Ga_{0.2}Al_{0.3}P$ layer doped with selenium in the concentration of $1 \times 10^{18}$ cm$^{-3}$ and having a thickness of 1.5 $\mu$m. Active layer 20 was an n type $In_{0.5}Ga_{0.5}Al$ layer having a thickness of 0.1 $\mu$m. Second cladding layer 18 was a p type $In_{0.5}Ga_{0.2}Al_{0.3}P$ layer doped with magnesium in the concentration of $2 \times 10^{18}$ cm$^{-3}$ and having a thickness of 1.0 $\mu$m. Third cladding layer 24 was a p type $In_{0.5}Ga_{0.4}Al_{0.1}P$ layer doped with magnesium in the concentration of $2 \times 10^{18}$ cm$^{-3}$ and having a thickness of 0.02 $\mu$m. Fourth cladding layer 26 was a p type layer of $In_{0.5}Ga_{0.2}Al_{0.3}P$, doped with magnesium in the concentration of $2 \times 10^{18}$ cm$^{-3}$ and having a thickness of 1.4 $\mu$m. First contact layer 30, which serves as an intermediate contact layer, was a p type $In_{0.5}Ga_{0.4}Al_{0.1}P$ layer having a thickness of 0.01 $\mu$m. Second contact layer 32 was a p type GaAs layer having a thickness of 0.5 $\mu$m. Both contact layers 30 and 32 were doped with magnesium in the concentration of $2 \times 10^{18}$ cm$^{-3}$. It should be noted that in the generic symbol of the double hetero-structure, $In_xGa_{1-x-y}Al_yP$ ($0 \leq y \leq 1$), y is preferably 0.8 or greater.

After the double hetero-structure had been formed using the MOCVD method, a linear stripe film 40 of silicon oxide (SiO$_2$) was formed on second contact layer 32, i.e., the topmost layer of the hetero-structure, by decomposing silane gas and by performing the conventional photoetching. This film was 0.1 $\mu$m thick and 5 $\mu$m width. FIG. 2A shows the cross-sectional view of the multilayer wafer thus obtained.

Thereafter, second contact layer 32 was subjected to selective etching, by using SiO$_2$ film 40 as a mask, thereby forming a GaAs mesa-shaped stripe 32' having a width of about 3 $\mu$m, as illustrated in FIG. 2B. As a result, think contact layer 30 underlying layer 32 was partially exposed.

Mesa-shaped stripe 32' was used as a mask in the subsequent process of selectively etching the InGaAlP layers 26 and 30. Layers 26 and 30 were etched away, except for those portions lying under mesa-shaped strip 32', thereby exposing third cladding layer 24. Mesa-shaped InGaAlP stripe 26' having a thickness of about 5 μm was therefore formed. An etchant such as a solution of sulfuric acid or phosphoric acid was used in this selective etching, at a temperature of 40° to 130° C.

Figure 2D:
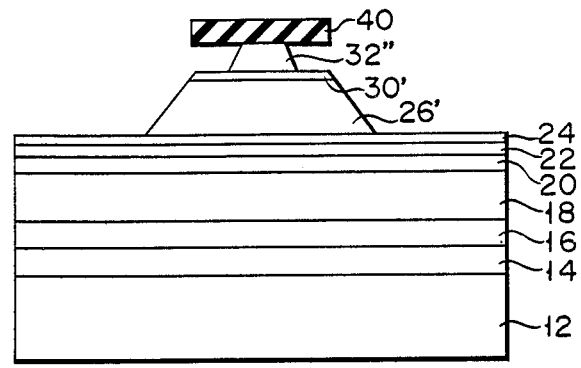

The wafer having two mesa-shaped stripes 32' and 26' was subjected to selective side-etching. Mesa-shaped stripe 32' made of GaAs was side-etched, becoming stripe 32" narrower than mesa-shaped stripe 26' as is illustrated in FIG. 2D. The etchant used in the selective side-etching was a solution consisting of 28% ammonia water, 35% aqueous solution of hydrogen peroxide, and water in the volume ratio of 1:30:9.

Figure 2E:
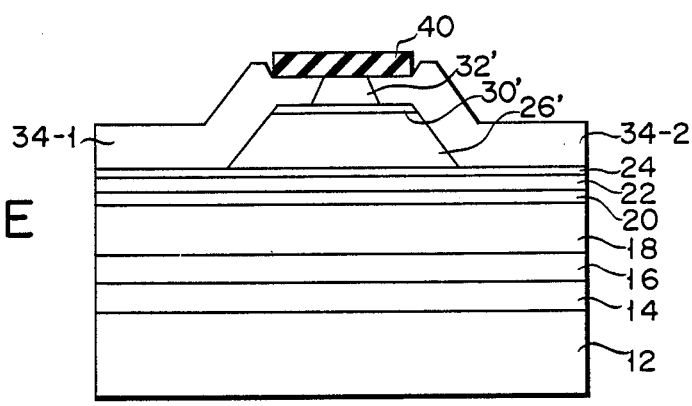

Current-blocking layers 34-1 and 34-2, i.e., an n type $Ga_{1-z}Al_zAs$ ($0 \leq z \leq 1$) layer, were formed on the structure of FIG. 2D by MOCVD method under a reduced pressure, by using trimethyl gallium and arsine. These were n-GaAs current-blocking layers which had a thickness of 0.5 μm and were doped with selenium in the concentration of $5 \times 10^{18}$ cm$^{-3}$. More specifically, layers 34-1 and 34-2 were formed in the following manner. The unfinished product was placed in an envelope. While introducing diluted phosfine gas into the envelope, the temperature within the envelope was raised to 700° C. Then, the supply of phosphine gas was stopped, and arsine gas was introduced into the envelope. Upon lapse of about one second from the start of supplying arsine gas, trimethyl gallium organic metal gas was introduced into the envelope, thereby forming current-blocking layers 34-1 and 34-2 on only second contact layer 24 and mesa-shaped layers 26', 30' and 32'. No GaAs layers were formed on SiO2 mask layer 40. As a result, such a structure as is shown in FIG. 2E was obtained.

Figure 2F:
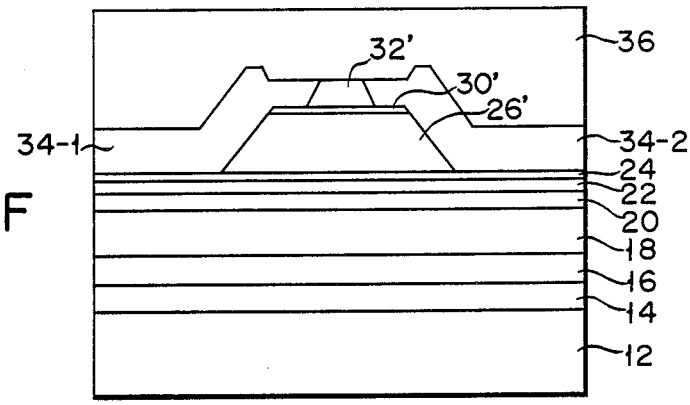

Thereafter, SiO2 mask layer 40 was removed, and n-GaAs layer 36 was formed by the MOCVD method on both current-blocking layers 34-1 and 34-2. As is shown in FIG. 2F, the upper surface of layer 36 was flat. Layer 36 functions as the third contact layer of laser diode 10. It had a thickness of 3 μm and was doped with magnesium in the concentration of $5 \times 10^{18}$ cm$^{-3}$. Then, electrode 38 (FIG. 1) was deposited on n-GaAs layer 36, and electrode 40 (FIG. 1) was deposited on the lower surface of substrate 12. Both electrodes 38 and 40 were made of a gold-zinc alloy or a gold-germanium alloy. As a result, a laser wafer was manufactured.

The wafer was cleaved, thereby producing an InGaAlP laser diode of double-hetero structure, which had a resonance wavelength of 250 μm. The laser diode was found to emit a laser beam having a wavelength ranging from 650 nm to 680 nm, almost all visible rays. The diode was tested for determining its characteristics. It had good fundamental characteristics; its threshold current was 90 mA, and its differential quantum efficiency was 20% for each side. In addition, it exhibited a good current-output characteristic, wherein the output linearly increased up to 20 mW or a little more as the drive current was increased. Further, it was demonstrated that optical images at the far and near points of the visual field of this laser diode exhibited an ideal unipeak characteristic. This implies that a stable mode control had been successfully achieved on the laser diode.

It should be noted that current-blocking layers 34-1 and 34-2 are not limited to n type $Ga_{1-z}Al_zAs$ ($0 \leq z \leq 1$) layers. For example, layers 34-1 and 34-2 may be made of InP when substrate 12 is made of InP and the double-hetero junction is an $In_{1-x-y}Al_yAs$ ($0 \leq y \leq 1$) layer. A laser diode of this structure was also manufactured, and was tested. This laser diode also exhibited good characteristics, and a stable mode control could be conducted on it.

In InAaAlP laser diode 10 having a mesa-shaped waveguide structure, which has been described above, current-blocking layers 34-1 and 34-2 are made of the same III-V semiconductor compound (i.e., GaAs) as substrate 12. Therefore, it is possible to form current blocking layers 34 of high quality wherein the generation of a lattice defect or dislocation can be mnimized even at the stepped portions of the mesa stripe waveguide channel thereof. A laser diode, which has excellent characteristics in the fundamental single transverse oscillation mode and astigmatism and high operational reliability can thus be obtained by using a specific semiconductor material, such as InGaAlP or InGaAlAs, which is very difficult to deposit to form a uniform layer, though it can emit laser light having a wavelength over a broad range. The use of this particular material makes it possible to employ a known method to manufacture a laser diode which is sufficiently reliable, and can, thus, be practically used, unlike the conventional laser diodes. In other words, the invention can solve the problems inherent in the manufacture of semiconductor lasers, which the persons skilled in the art have long known, but failed to overcome.

The inventors have made semiconductor lasers of two types, each type having the known structures, in order to demonstrate the drawbacks inherent therein.

Each of the lasers of the first type was made in the following way. At a pressure lower than atmospheric pressure, a gas mixture of a methane-series III-group organic metal (i.e., trimethyl indium, trimethyl gallium or trimethyl aluminum) and a hydride of V-group metal (e.g., arsine or phosphine) was thermally decomposed, thereby forming a mesa-shaped InGaAlAs or InP layer on an InP substrate. Then, the same gas mixture was thermally decomposed, thus forming an InGaAlAs or an InP layer on the mesa-shaped InGaAlAs or InP layer and also on the InP substrate.

Each of the lasers of the second type was made in the following manner. A mesa-shaped InGaAlP or GaAlAs layer was formed on a GaAs substrate in a method similar to the method described in the preceding paragraph. Then, a mesa-shaped layer was formed on the InGaAlP or GaAlAs layer. Thereafter, an InGaAlP layer or an GaAlAs layer was formed on the mesa-shaped layer and also on the GaAs substrate.

In the structures of the first type, InP could easily be grown on the InGaAlAs or InP layer, but it was difficult to grow InGaAlAs on the InGaAlAs or InP layer. In the case of the layers of the second type, GaAlAs could easily be grown on the GaAlAs or InGaAlP layer, but it was difficult to grow high-quality material, InGaAlP, on the GaAlAs or InGaAlp layer. Next, an X-ray diffraction analysis was conducted on these layers. The results were that, in the sample using the combination of InGaAlAs and InGaAlAs lyyers, a clear difference was observed between the lattice constant of the mesa-shape layer at the slanted side and that at the flat top portion thereof. Inevitably, many dislocations were observed in the InGaAlAs layer covering the slanted sides of the mesa-shaped layer.

The difficulty of re-growth of InGaAlP or InGaAlAs on the mesa-shaped layer may b explained as follows. In the case of InGaAlAs or InGaAlP, the dislocation can be attributed to the fact that the lattice constants of its components, InP, GaP and AlP are greatly different from that of GaAs with which InGaAlP must be lattice-matched. This lattice constant difference makes it harder to manufacture the multilayered structure of a semiconductor laser diode. As a result, when such a semiconductor material is re-grown on the mesa-shaped layer, the crystallizing process of the slanted sides of the mesa-shaped layer is greatly different from that at the flap top portion, thereby causing a mismatch in the semiconductor crystal structure thus obtained.

As has been pointed out, an InP layer could easily be grown on the mesa-shaped layer of InGaAlAs or InP, and GaAlAs could easily been formed on the mesa-shaped layer of InGaAlp or GaAlAs. This is because InP contains a V-element (P) like the material (InP) of the substrate with which InP must be lattice-matched well, and GaAlAs contains a V-element (As) like the material (GaAs) of the substrate with which GaAlAs must be lattice-matched.

Further, according to the present semiconductor laser, the laser channel is made of mesa-shaped cladding layer 26, and cladding layer 26 is electrically connected to electrode layer 38 by contact layers 30, 32 and 36 formed one upon another. Cladding layer 26 can, therefore, guide light very effectively, thereby raising the light emission efficiency of the laser. Since thin contact layer 30 is formed on the top surface of mesa-shaped layer 26, thereby providing an appropriate band gap between layer 26 and second contact layer 32, it can lower the electrical resistance between layers 26 and 32. Furthermore, since upper contact layer 36 has a flat top surface, it has a sufficiently low contact resistance and can minimize the deforming of electrode layer 38 formed on it. These features can help to improve the characteristics and reliability of the semiconductor laser.

As has been stated, it is possible with the method of this invention to manufacture InGaAlP laser diode 10 having a mesa-shaped waveguide, by using the ordinary processing, not employing fine-processing technology. The method can, therefore, easily manufacture laser diode 10 with a high reproducibility. More specifically, since the waveguide of laser diode 10 is formed by selective etching (See FIG. 2D), and the current-blocking structure is formed by the MOCVD method (See FIG. 2E). The selective etching and MOCVD method are the processes commonly used today in manufacturing semiconductor devices, and neither have serious drawbacks. Therefore, diode 10 can be produced with a high yield and a high productivity.

In the embodiment described above InGaAlP (or GaAlAs) and GaAs layers constitute an optical waveguided and a current-blocking structure. To this end, another semiconductor material InGaAlP must be re-grown on the exposed surfaces of the GaAs substrate and mesa-shaped InGaAlP layer. Generally, it is usually hard for InGaAlP and GaAs layers to prevent the surface of a GaAlAs or InGaAlP layer from being damaged by the evaporation of P and As occurring as an unfinished product is heated. In the method of the invention, however, $SiO_2$ film 40, which covers the top surface of GaAs layer 12, can prevent P and As from evaporating, and the GaAlAs or InGaAlP layer from being damaged. Either GaAlAs or InGaAlP can be re-grown to have a smooth, flat top surface, by heating the unfinished product in an atmosphere of phosphorus.

Still further, in the above embodiment, mesa-shaped contact layer 32 is fabricated to have a width of 3 μm at the top, which is smaller than the width (5 μm) of $SiO_2$ layer 40 as shown in FIG. 2F. Due to this fact, those portions of layers 34-1 and 34-2 which are located around contact layer 32, forming a current path, along with layer 34, have flat top surfaces. Thus, contact layer 36, formed on layers 32, 34-1 and 34-2, can have a flat top surface, and electrode layer 38 can easily be formed on contact layer 36.

Figure 3:
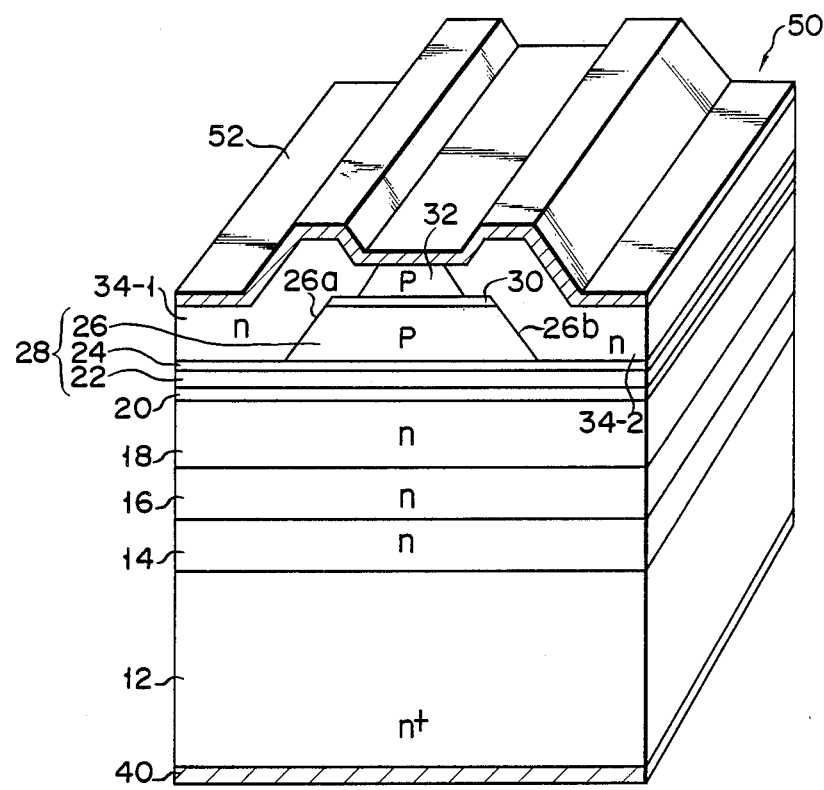
FIG. 3 is a perspective view (not drawn to scale) of a semiconductor layer diode capable of stably operating in a transverse mode, in accordance with another preferred embodiment of the invention.

FIG. 3 shows laser diode 50 having a mesa-shaped waveguide, or a second embodiment of the present invention. The same elements as those of the first embodiment are designated by the same numerals as in FIG. 1, and will not described in detail.

Laser diode 50 has no member equivalent to thick contact layer 36 (FIG. 1). Electrode layer 52 is, therefore, formed directly on current-blocking layers 34-1 and 34-2 surrounding mesa-shaped contact layer 32. Electrode layer 52 is electrically and directly coupled to contact layer 32. In laser diode 50, too, currentblocking layers 34-1 and 34-2 ar made of the same material as that of substrate 12, i.e., a III-V compound semiconductor, more precisely $Ga_{1-z}Al_zAs$ ($0 \leq z \leq 1$). In this instance, layers 34-1 and 34-2 are made of n-GaAs. Without thick contact layer 36, laser diode 50 can be manufactured in less steps, which will ultimately reduce the cost of diode 50.

Figure 4:
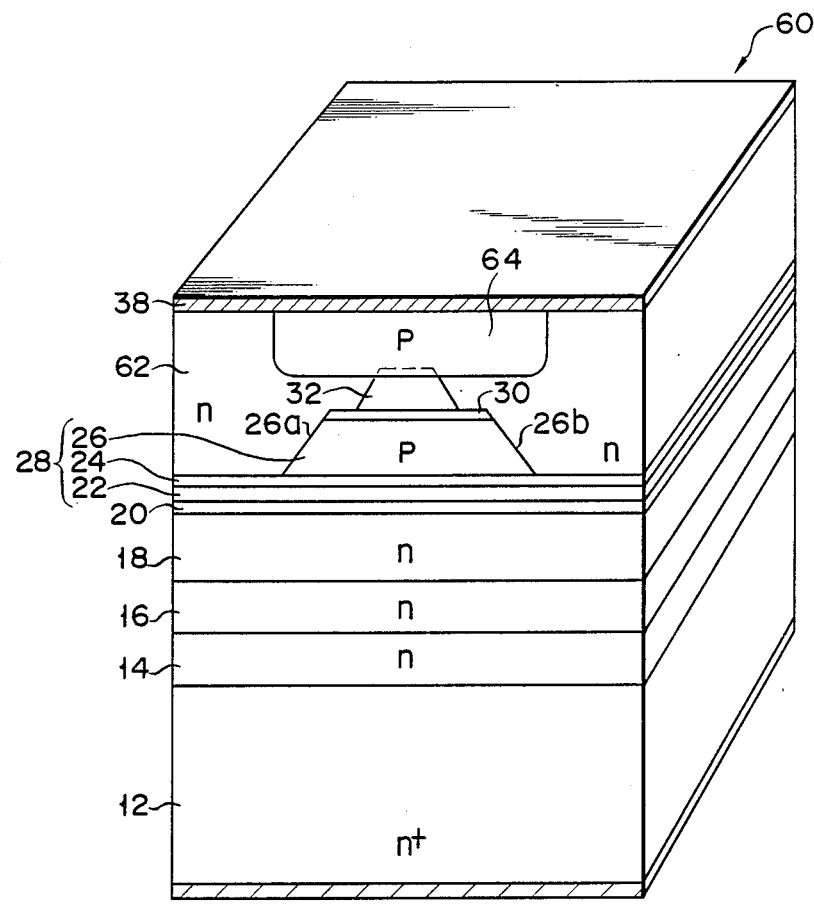
FIG. 4 shows a perspective view (not drawn to scale) of a semiconductor layer diode capable of stably operating in a transverse mode, in accordance with still another preferred embodiment of the invention.

FIG. 4 shows laser diode 60, or a third embodiment of the present invention. The same elements as those of the first embodiment are designated by the same numerals as used in FIG. 1, and will not described in detail.

In the third embodiment, current-blocking layer 62 covers mesa-shaped cladding layer 26 and mesa-shaped contact layer 32. Layer 32 has a flat top surface. It is made of the same material as that of substrate 12, i.e., a III-V compound semiconductor, more precisely $Ga_{1-z}Al_zAs$ ($0 \leq z \leq 1$). $SiO_2$ layer 40 (FIG. 2) is removed before current-blocking layer 62 is formed by re-growth of $Ga_{1-z}Al_zAs$. A p-type semiconductor diffusion layer 64 is formed in current-blocking layer 62 by diffusing or ion-implanting a p-type dopant such as Zn into layer 62, and is so deep that it overlaps mesa-shaped contact layer 32. Electrode layer 38 is formed on the flat top surface of layer 62. Diffusion layer 64 is, therefore, interposed between mesa-shaped contact layer 26 and electrode layer 38, and reduces the electrical resistance between layers 26 and 38.

Although the invention has been described with reference to specific embodiments, it should be understood by those skilled in the art that numerous modifications can be made within the spirit and scope of the inventive contribution.

What is claimed is:

1. In a semiconductor laser for emitting a continuous laser light having a wavelength within the visible wavelength range, comprising:
   a semiconductor substrate of a first conductivity type of a III-V compound semiconductor material;
   a first semiconductor cladding layer of the first conductivity type provided above said substrate;
   an active layer of semiconductor material formed on said cladding layer;
   a plurality of semiconductor cladding layers of a second conductivity type formed on said active layer, thereby forming a double hetero-structure;

a first semiconductive contact layer of the second conductivity type which is mesa-shaped and has slanted sides; and conductive layer means for serving as terminal electrodes of said laser, the improvement wherein said cladding layers include;

a second semiconductor cladding layer formed directly on said active layer, and a third semiconductor cladding layer formed on said second cladding layer, being mesa-shaped, and having slanted sides defining a waveguide channel, said first to third cladding layers being made of a specific III-V compound semiconductor material comprising at least indium, aluminum and phosphorus; the improvement comprising:

a second semiconductive contact layer provided between said third cladding layer and said first contact layer, having a band gap width which is smaller than that of said third cladding layer and yet greater than that of said first contatt layer, for reducing the rate of band gap variation therebetween, and a semiconductive, current-blocking layer covering the slanted sides of said third cladding layer and also the slanted sides of said first contact layer, said current-blocking layer being made of III-V compound semiconductor material.

2. In a semiconductor laser for emitting a continuous laser light of visible wavelength range, comprising:

a semiconductor substrate of a first conductivity type made of III-V compound semiconductor material;

a first semiconductor cladding layer of the first conductivity type provided above said substrate;

an active layer of semiconductor material formed on said cladding layer;

a plurality of semiconductor cladding layers of a second conductivity type formed on said active layer, thereby forming a double hetero-structure;

a first semiconductive contact layer of the second conductivity type which is mesa-shaped ans has slanted sides, said first contact layer comprising a gallium-arsenide based semiconductor material; and conductive layer means for serving as terminal electrodes of said laser, the improvement wherein said cladding layers include, a second semiconductor cladding layer formed on said active layer, and a third semiconductor cladding layer formed on said second cladding layer, being mesa-shaped, and having slanted sides defining a waveguide channel, said first to third cladding layers being made of a compound semiconductor material comprising a specific III-V compound semiconductor material containing indium, aluminum and phosphorus, and the improvement further comprising:

a second semiconductive contact layer provided between said third cladding layer and said first contact layer for serving as an intermediate contact layer having a band gap width which is smaller than that of said third cladding layer and yet greater than that of said first contact layer to thereby reduce the rate of band gap variation between said third cladding layer and said first contact layer so that an electrical resistance therebetween is lowered, said second contact layer comprising III-V compound semiconductor material containing at least indium, gallium and phosphorus; and a semiconductive, current-blocking layer covering the slanted sides of said third cladding layer and also the slanted sides of said first contact layer, said current-blocking layer being made of III-V compound semiconductor material which contains at least one of gallium and laumium as its III semiconductor element, and arsenide as its V semiconductor element.

3. The semiconductor laser according to claim 1, wherein said double hetero-structure is made of one material selected from the group consisting of $In_xGa_{1-x-y}Al_yP$ ($0 \leq y \leq 1$); and $In_xGa_{1-x-y}Al_yAs$ ($0 \leq y \leq 1$).

4. The seiiconductor laser of claim 1, wherein coefficient "y" is 0.8 or greater.

5. The semiconductor laser of claim 3, wherein said substrate is made of GaAs, and said current-blocking layer is made of $Ga_{1-z}Al_zAs$ ($0 \leq z \leq 1$).

6. The semiconductor laser of claim 5, wherein said substrate and said current-blocking layer are made of GaAs.

7. The semiconductor laser of claim 3, wherein said substrate and said current-blocking layer are made of InP.

8. The semiconductor laser of claim 1, further comprising: a second semiconductive contact layer of the second conductivity type covering the top surfaces of said first contact layer and said current-blocking layer, and being thick enough to have a flat top surface.

9. The semiconductor laser of claim 8, further comprising a fourth cladding layer of the first conductivity type formed on said second cladding layer and contacting said third cladding layer and said current-blocking layer.

10. The semiconductor laser of claim 9, wherein said first to fourth claddinq layers are made of a material selected from the group consisting of $In_xGa_{1-x-y}Al_yP$ ($0 \leq y \leq 1$); and $In_xGa_{1-x-y}Al_yAs$ ($0 \leq y \leq 1$).

11. The semiconductor laser of claim 10, wherein coefficient "y" is 0.8 or greater.

12. The semiconductor laser of claim 11, wherein said substrate is made of GaAs, and said current-blocking layer is made of $Ga_{1-z}Al_zAs$ ($0 \leq z \leq 1$).

13. The semicondcutor laser of claim 12, wherein said current-blocking layer is made of GaAs.

14. The semiconductor laser of claim 11, wherei said substrate and said current-blocking layer are made of InP.

* * * * *